US012777634B2

(12) United States Patent
Fang et al.

(10) Patent No.: US 12,777,634 B2
(45) Date of Patent: Oct. 27, 2026

(54) SEMICONDUCTOR STRUCTURE AND METHOD OF FORMING THE SAME

(71) Applicant: Winbond Electronics Corp., Taichung City (TW)

(72) Inventors: Wei-Zhi Fang, Tainan City (TW); Shu-Ming Li, Taichung City (TW); Tzu-Ming Ou Yang, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 614 days.

(21) Appl. No.: 18/310,722

(22) Filed: May 2, 2023

(65) Prior Publication Data

US 2024/0164087 A1 May 16, 2024

(30) Foreign Application Priority Data

Nov. 10, 2022 (TW) .................................. 111142930

(51) Int. Cl.
*H10B 12/00* (2023.01)

(52) U.S. Cl.
CPC ........... *H10B 12/482* (2023.02); *H10B 12/02* (2023.02)

(58) Field of Classification Search
CPC ... H10B 12/482; H10B 12/02; H10B 12/0335
See application file for complete search history.

(56) References Cited

U.S. PATENT DOCUMENTS 8,642,466 B2 2/2014 Kim
9,508,649 B2 * 11/2016 Lee ...................... H10B 12/482
11,239,111 B1 2/2022 Huang et al.
2016/0172304 A1 * 6/2016 Lee ..................... H01L 21/7682 438/655
2019/0123051 A1 * 4/2019 Park ..................... H10B 12/482
2020/0105867 A1 * 4/2020 Lee ...................... H10D 30/024
2022/0165736 A1 * 5/2022 Ryu ..................... H10B 12/315
2022/0271039 A1 * 8/2022 Lee ........................ H10B 12/30
2022/0336465 A1 * 10/2022 Kim ................... H10B 12/0335
2023/0009103 A1 * 1/2023 Won ..................... H10B 12/482
2023/0225106 A1 * 7/2023 Kung ..................... H10B 12/30 257/296

FOREIGN PATENT DOCUMENTS

CN 113675145 * 11/2021
TW I765694 B 5/2022

OTHER PUBLICATIONS

CN 113675145 machine translation (Year: 2021).*

* cited by examiner

*Primary Examiner* — Yasser A Abdelaziez
(74) *Attorney, Agent, or Firm* — MUNCY, GEISSLER, OLDS & LOWE, P.C.

(57) ABSTRACT

The method of forming the semiconductor structure includes the following steps. Bit line structures are formed on a substrate. A first liner is formed on the bit line structures. A second liner is formed on the first liner. A portion of the second liner is removed to expose a portion of the top surface of the first liner. A portion of the first liner is removed to form a space between each bit line structure and the second liner and form a remaining first liner. A sealing material is formed at the opening of the space to form an air gap between each bit line structure and the second liner.

14 Claims, 6 Drawing Sheets

100

100

SEMICONDUCTOR STRUCTURE AND METHOD OF FORMING THE SAME

CROSS REFERENCE TO RELATED APPLICATIONS

This application claims the priority benefit of Taiwan application serial no. 111142930, filed on Nov. 10, 2022. The entirety of the above-mentioned patent application is hereby incorporated by reference herein and made a part of this specification.

BACKGROUND OF THE INVENTION

Field of the Invention

The present disclosure relates to a semiconductor structure and a method of forming the same, and in particular, to a semiconductor structure that includes an air gap and a method of forming the same.

Description of the Related Art

As the semiconductor structure (e.g., dynamic random access memory, DRAM) shrinks, the storage capacitance per unit in the semiconductor structure decreases accordingly, and the influence caused by the bit line capacitance increases accordingly. For example, excessive bit line capacitance may cause the signal amplifier to fail to correctly identify signals that are read or stored, and in severe cases, it will cause semiconductor structure failure.

BRIEF SUMMARY OF THE INVENTION

The embodiment of the present disclosure provides a semiconductor structure and a method of forming the same, which may form an air gap in the semiconductor structure, thereby reducing the bit line capacitance and improving the operating range of the semiconductor structure.

An embodiment of the present disclosure includes a method of forming a semiconductor structure, and the method of forming the semiconductor structure includes the following steps. Bit line structures are formed on a substrate. A first liner is formed on the bit line structures. A second liner is formed on the first liner. A portion of the second liner is removed to expose a portion of the top surface of the first liner. A portion of the first liner is removed to form a space between each bit line structure and the second liner and to form a remaining first liner. A sealing material is formed at the opening of the space to form an air gap between each bit line structure and the second liner.

An embodiment of the present disclosure includes a semiconductor structure. The semiconductor structure includes a substrate and bit line structures disposed on the substrate. The semiconductor structure also includes a liner structure disposed on the bit line structures and a specific liner disposed between the bit line structures and the liner structure. An air gap is formed between the specific liner and the liner structure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

FIGS. 1 to 5 are partial cross-sectional views illustrating various stages of a method for forming a semiconductor structure 100 according to some embodiments of the present disclosure. FIG. 6 is a partial top view illustrating the semiconductor structure 100 according to the embodiment of the present disclosure. For example, FIGS. 1 to 5 may be partial cross-sections drawn along line A-A' in FIG. 6, but the present disclosure is not limited thereto. It should be noted that some components of the semiconductor structure 100 have been omitted in FIGS. 1 to 6 for the sake of brevity.

Figure 1:
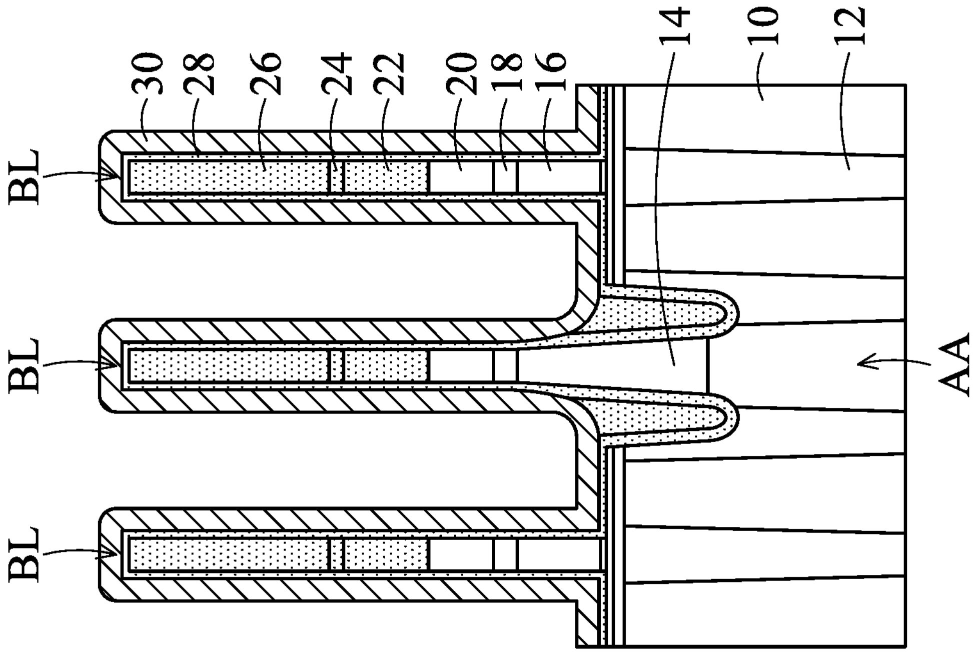

Referring to FIG. 1, bit line structures BL are formed on a substrate 10. The substrate 10 may include, for example, a bulk semiconductor substrate or include a composite substrate formed of different materials, and the substrate 10 may be doped (for example, using p-type or n-type dopants) or undoped. The substrate 10 may include a semiconductor substrate (e.g., a silicon substrate, a silicon germanium substrate, or a silicon carbide substrate), an aluminum nitride substrate, a sapphire substrate, the like, or a combination thereof, but the present disclosure is not limited thereto. The substrate 10 may also include a semiconductor-on-insulator (all) substrate formed by disposing a semiconductor material (e.g., silicon) on an insulating layer.

The substrate 10 includes an isolation component 12, which may be used to separate different device regions in the substrate 10 and define an active area AA. For example, the isolation component 12 includes shallow trench isolation (STI). The isolation component 12 includes, for example, a single-layer or multi-layer insulating material (e.g., silicon oxide, silicon nitride, or silicon oxynitride).

The bit line structure BL includes a semiconductor layer 14 or 16, a barrier layer 18, and a metal layer 20. The barrier layer 18 is disposed on the semiconductor layer 14 or 16, and the metal layer 20 is disposed on the barrier layer 18. The semiconductor layer 14 is, for example, doped polysilicon and extends into the substrate 10, and is in contact with the active area AA of the substrate 10. That is, in some embodiments, the semiconductor layer 14 is electrically connected to the active area AA of the substrate 10. The semiconductor layer 16 is, for example, undoped polysilicon. The barrier layer 18 may include titanium nitride (TiN) or tungsten nitride (WN), and the metal layer 20 may include tungsten (W), but the present disclosure is not limited thereto. The barrier layer 18 and the metal layer 20 may be formed by a deposition process.

The bit line structure BL also includes an insulating stack layer disposed on the metal layer 20, and the insulating stack layer may include, for example, an insulating layer 22, an insulating layer 24, and an insulating layer 26, but the present disclosure is not limited thereto. The insulating layer 22, the insulating layer 24, and the insulating layer 26 may include silicon nitride ($Si_3N_4$) or silicon oxide ($SiO_2$), and may be formed by a deposition process.

The bit line structure BL further includes a liner layer 28, and the liner layer 28 is a material with a low dielectric constant (low-K), such as nitride. The liner layer 28 is disposed on the semiconductor layer 14 or 16, the barrier layer 18, the metal layer 20, and the insulating stack layer. In detail, the liner layer 28 may be disposed on the sidewalls of the semiconductor layer 14 or 16, the barrier layer 18, the metal layer 20, and the insulating stack layer, and the top surface of the insulating stack layer, but the present disclosure is not limited thereto.

Then, a first liner 30 is formed on the bit line structures BL. In detail, the first liner 30 may be conformally formed on the substrate 10 and the liner layer 28 of the bit line structure BL. The first liner 30 includes oxide, for example. In one embodiment, the first liner 30 is silicon oxide ($SiO_2$), but the present disclosure is not limited thereto. As long as the material of the first liner 30 and the subsequently formed second liner 32 have etching selectivity (i.e., the etching rates of the first liner 30 and the second liner 32 are different), it may be applied to the present disclosure. The first liner 30 may be formed by a deposition process. For example, the deposition process is, but not limited to, chemical vapor deposition, atomic layer deposition, molecular beam epitaxy, liquid phase epitaxy, the like, or a combination thereof.

Figure 2:
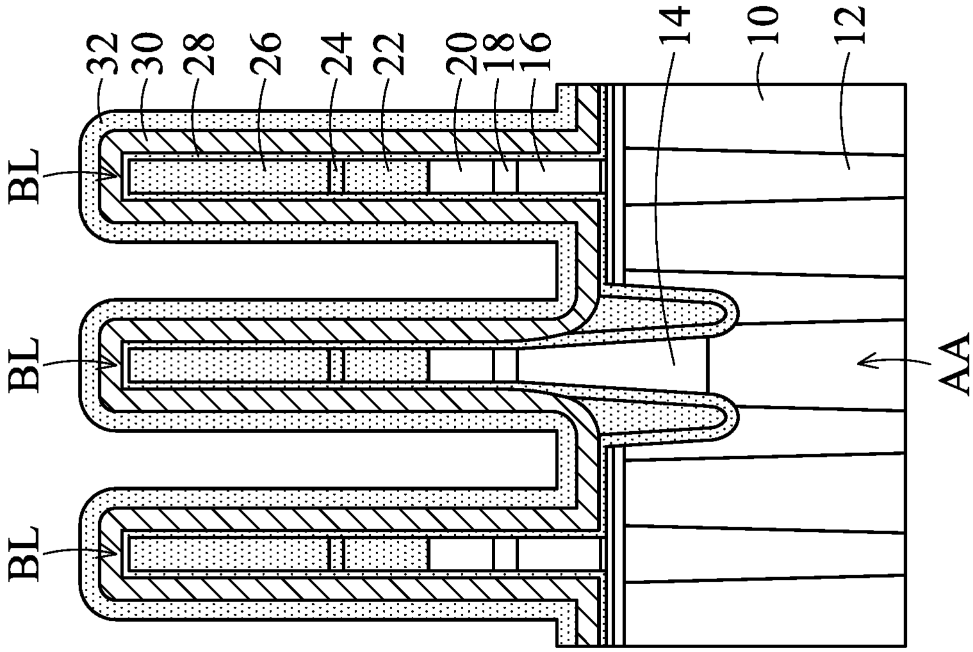
FIGS. 1 to 5 are partial cross-sectional views illustrating various stages of a method for forming a semiconductor structure according to some embodiments of the present disclosure.

Referring to FIG. 2, a second liner 32 is formed on the first liner 30. In one embodiment, the second liner 32 is silicon nitride ($Si_3N_4$) and may be formed by a deposition process, but the present disclosure is not limited thereto.

Figure 3:
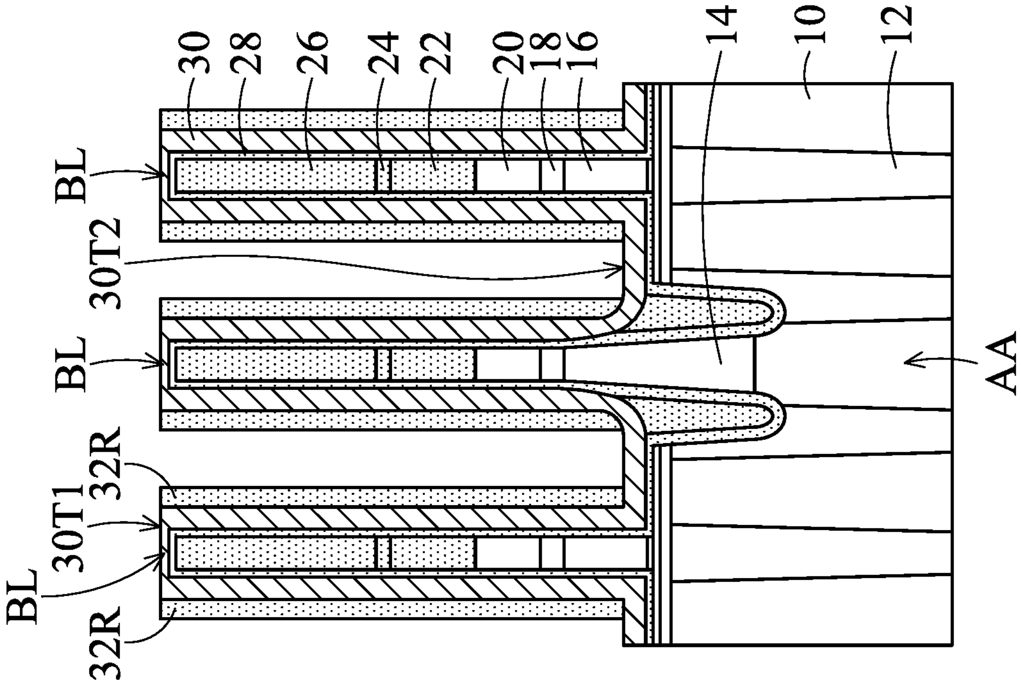

Referring to FIG. 3, in some embodiments, a portion of the second liner 32 is removed to expose a portion of the top surface of the first liner 30 (for example, including the first top surface 30T1 and the second top surface 30T2), and a remaining second liner 32R remains. The remaining second liner 32R is disposed on the sidewalls of the bit line structures BL. The first top surface 30T1 of the first liner 30 is on the topmost surface of each bit line structure BL, and the second top surface 30T2 is between the bottoms of two adjacent bit line structures BL. In other embodiments, a portion of the second liner 32 is removed to expose only the second top surface 30T2 of the first liner 30 shown in FIG. 3, so that the remaining second liner is on the top and sidewalls of the bit line structure BL. Specifically, during the process of removing the portion of the second liner 32, the first liner 30 may be slightly or not removed.

The portion of the second liner 32 may be removed by an etching process. For example, the etching process may include a dry etching process, a wet etching process, or a combination thereof. The dry etching process may include reactive ion etching (RIE), inductively-coupled plasma (ICP) etching, neutron beam etching (NBE), electron cyclotron resonance (ERC) etching, similar etching processes, or a combination thereof. The wet etching process may use, for example, hydrofluoric acid (HF), ammonium hydroxide ($NH_4OH$), or any suitable etchant for etching.

Figure 4:
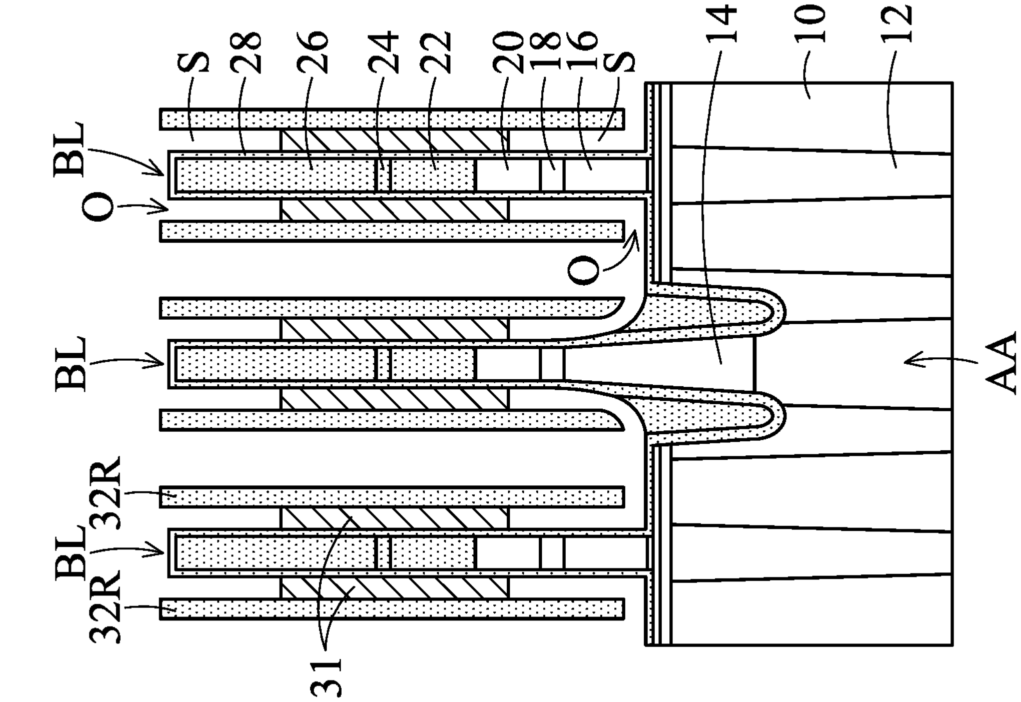

Referring to FIG. 4, a portion of the first liner 30 is removed, and a remaining first liner is left. In some embodiments, a wet etching process (e.g., using hydrofluoric acid (HF) as an etchant) is performed to etch the exposed first top surface 30T1 and second top surface 30T2 of the first liner 30 according to the etching selectivity of the first liner 30 and the second liner 32, so that a space S is formed between the bit line structure BL and the remaining second liner 32R. In other words, the portion of the first liner 30 on the top and bottom of the bit line structure BL is removed, and the remaining first liner 31 is close to the middle region of the sidewall of the bit line structure BL. In other embodiments, the remaining second liner are on the top and sidewalls of the bit line structure BL, and the exposed second top surface 30T2 of the first pad 30 shown in FIG. 3 is etched to form a space between the bit line structure BL and the remaining second liner, so that the remaining first liner is close to the middle and upper regions of the sidewalls of the bit line structure BL.

Figure 5:
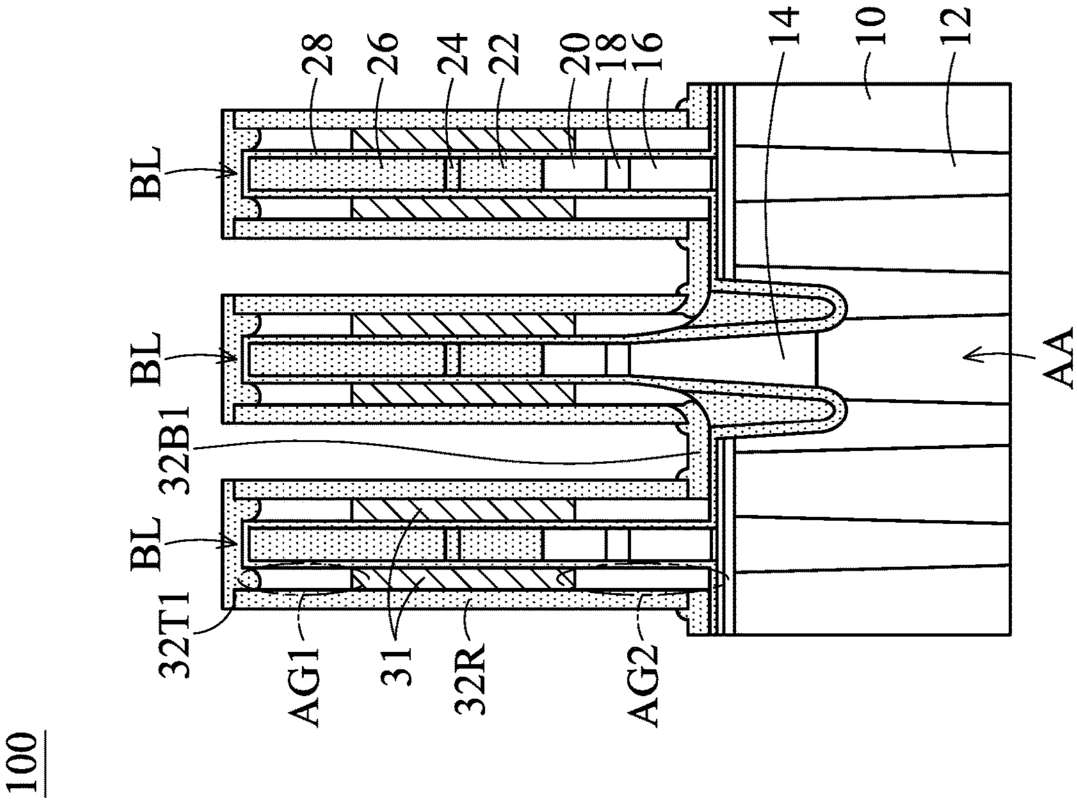
Figure 6:
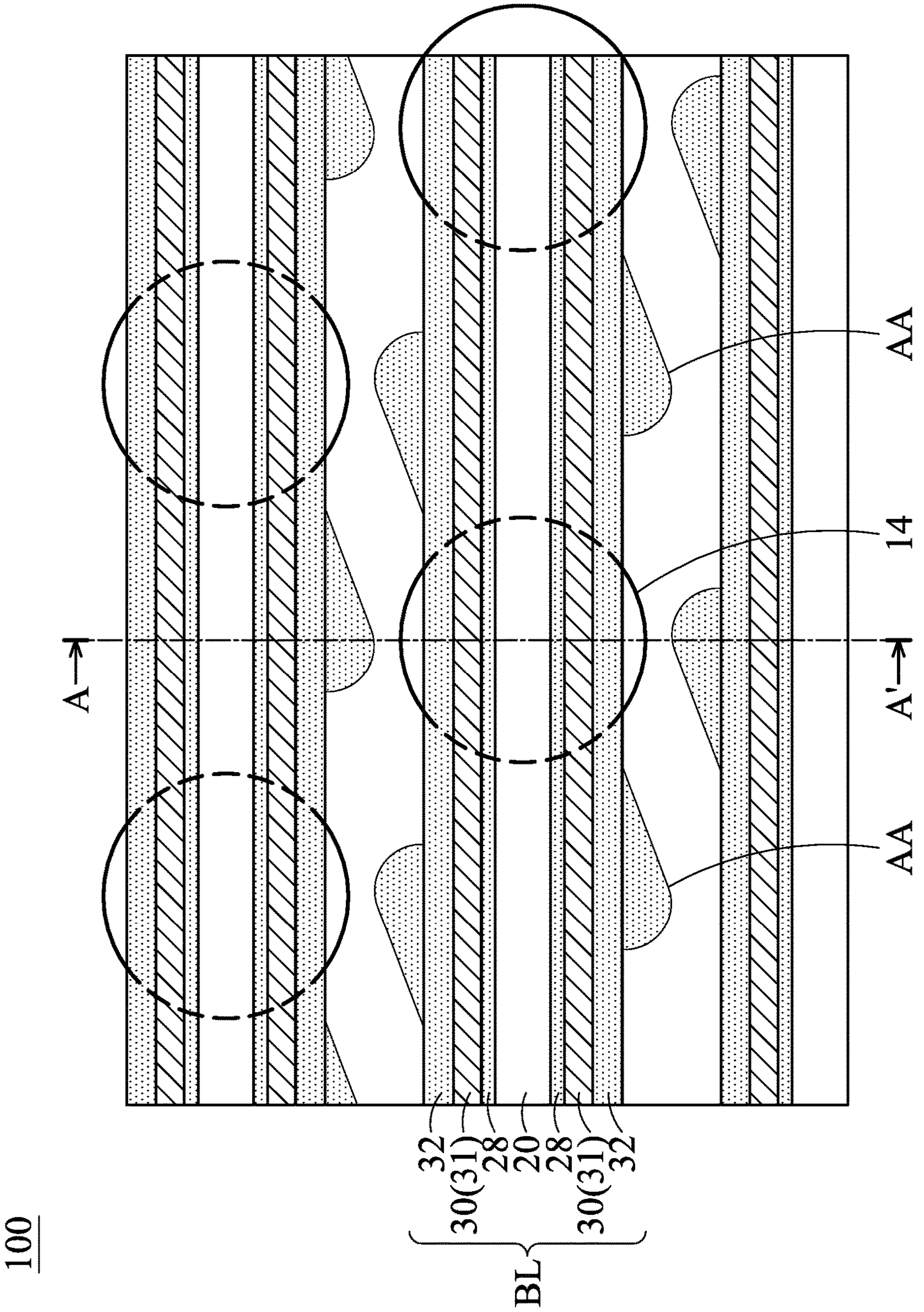
FIG. 6 is a partial top view illustrating the semiconductor structure according to the embodiment of the present disclosure.

Referring to FIG. 5, in some embodiments, a first sealing material 32T1 is formed on the bit line structure BL and a second sealing material 32B1 is formed between two adjacent bit line structures BL. In other words, a first sealing material 32T1 and a second sealing material 32B1 are formed at the opening O (shown in FIG. 4) of the space S next to the bit line structure BL, so that the first sealing material 32T1, the second sealing material 32B1, and the remaining second liner 32R are connected to each other to form an air gap AG1 and an air gap AG2 above and below the remaining first liner 31 respectively. In other embodiments, the remaining second liner are on the top and sidewalls of the bit line structure BL, and the space formed after the first liner is etched is next to the bottom of the bit line structure BL. Further, a second sealing material 32B1 as shown in FIG. 5 is formed at the opening of the space and an air gap is formed at the bottom of the bit line structure. The materials of the first sealing material 32T1 and the second sealing material 32B1 are not limited to be the same as or different from the remaining second liner 32R. In one embodiment, the materials of the first sealing material 32T1 and the second sealing material 32B1 are a material with a low dielectric constant, such as nitrides (e.g., silicon nitride). In this embodiment, the first sealing material 32T1, the second sealing material 32B1, and the remaining second liner 32R may be regarded as a liner structure of the semiconductor structure 100.

As shown in FIG. 5 and FIG. 6, in some embodiments, when the material of the remaining second liner 32R is same as that of the first sealing material 32T1 and the second sealing material 32B1, there is no interface between the remaining second liner 32R and the first sealing material 32T1 and the second sealing material 32B1. At this time, the first sealing material 32T1 and the second sealing material 32B1 may be used as a portion of the remaining second liner 32R (e.g., the first sealing material 32T1 serves as the upper second liner, and the second sealing material 32B1 serves as the lower second liner). The liner structure of the semiconductor structure 100 (that includes the remaining second liner 32R, the first sealing material 32T1, and the second sealing material 32B1)(conformally) covers the bit line structure BL and the substrate 10. The liner structure is disposed on the bit line structure BL, and a specific liner (i.e., the remaining first liner 31) is disposed between the bit line structure BL and the liner structure. Air gaps (e.g., air gap AG1 and air gap AG2) are formed between the specific liner and the liner structure.

In the embodiments of the present disclosure, the spaces where the air gap AG1 and the air gap AG2 exist may affect the capacitance of the bit line structure BL in the semiconductor structure 100. Since the air gap AG1 and the air gap AG2 may contain air (dielectric coefficient about 1.0054) or close to vacuum (i.e., low pressure with dielectric coefficient about 1.0), the bit line capacitance of the semiconductor structure 100 may be effectively reduced, thereby improving the operating range of the semiconductor structure 100.

Figure 7:
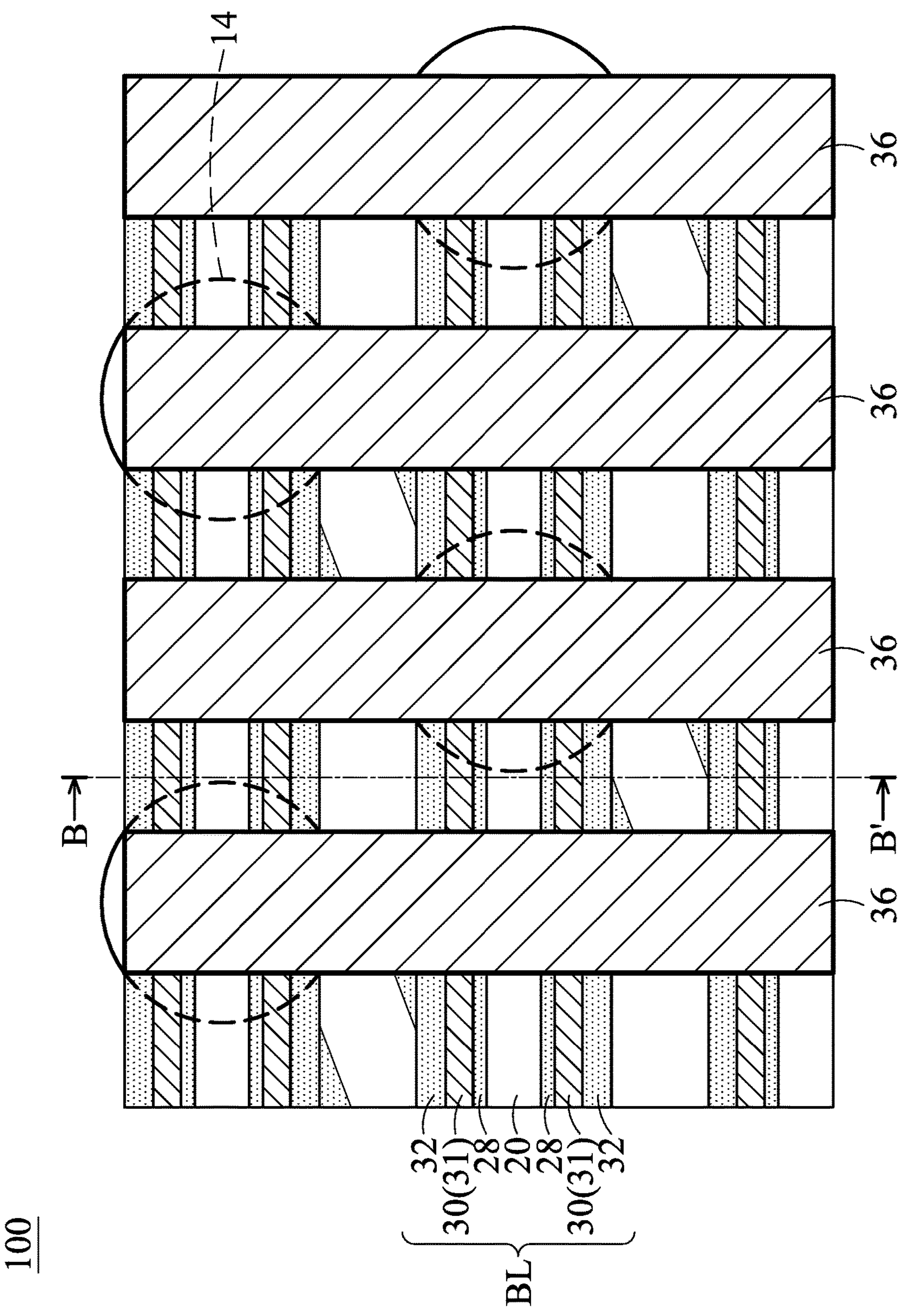
FIG. 7 is a partial top view illustrating the semiconductor structure according to the embodiment of the present disclosure.
Figure 8:
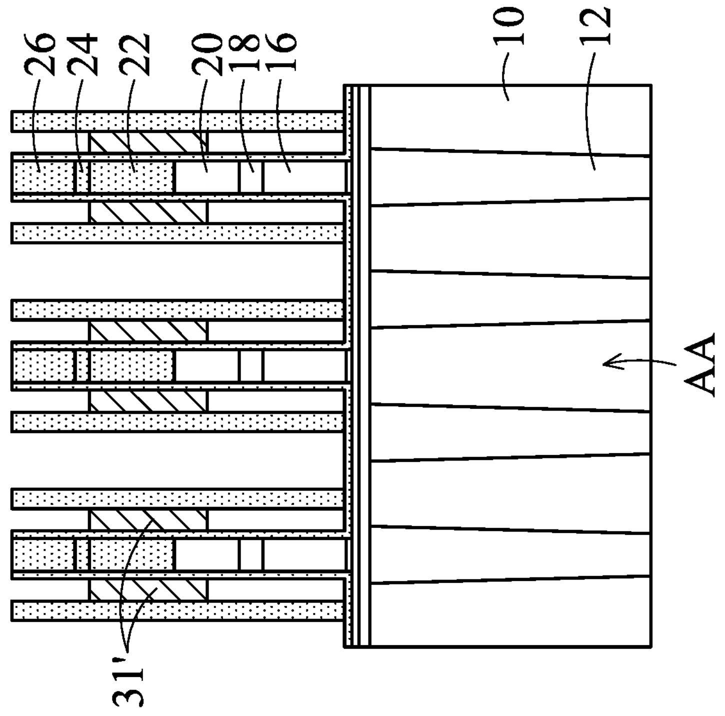
FIGS. 8 to 9 are partial cross-sectional views illustrating various stages of the method for forming the semiconductor structure according to some embodiments of the present disclosure.
Figure 9:
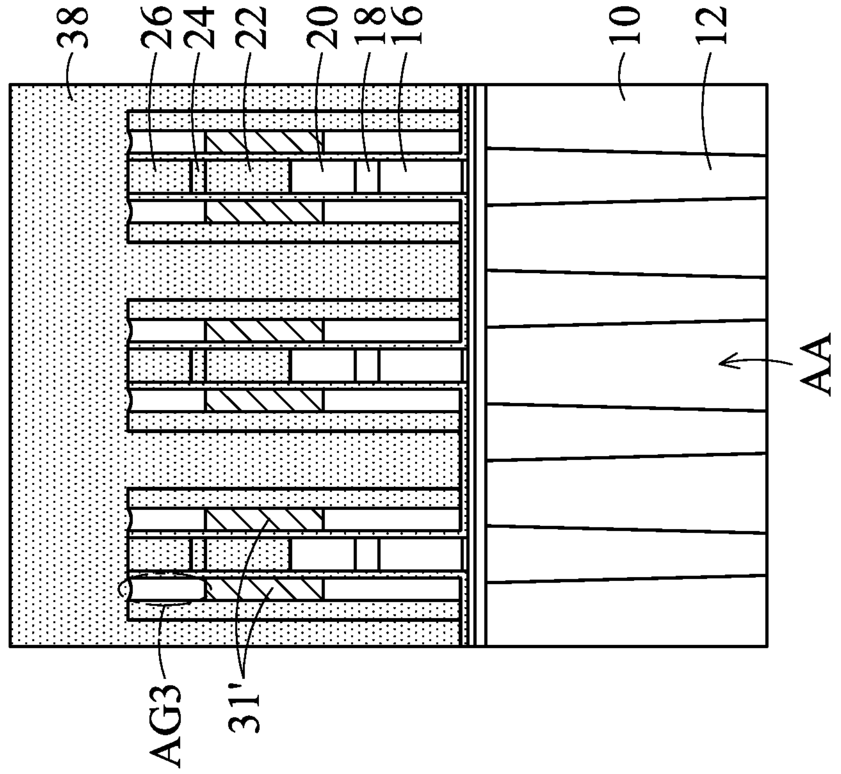

FIG. 7 is a partial top view illustrating the semiconductor structure 100 according to the embodiment of the present disclosure. For example, the stage of the semiconductor structure 100 shown in FIG. 7 may, for example, follow the stage of the semiconductor structure 100 shown in FIG. 6, but the present disclosure is not limited thereto. FIGS. 8 to 9 are partial cross-sectional views illustrating various stages of the method for forming the semiconductor structure 100 according to some embodiments of the present disclosure. For example, FIG. 8 to FIG. 9 may be partial cross-sections drawn along line B-B' in FIG. 7, but the present disclosure is not limited thereto. Similarly, some components of the semiconductor structure 100 have been omitted in FIGS. 7 to 9 or the sake of brevity.

Referring to FIG. 7, a coating layer is formed on the first sealing material 32T1, the second sealing material 32B 1, and the remaining second liner 32R, and the coating layer is patterned to form coating segments 36. For example, the coating layer may be spin-on glass (SOG), and it may be formed on the bit line structures BL to fill the spaces between the bit line structures BL. Then, the coating layer may be patterned according to the position of the semiconductor layer 14 to form coating segments 36. In other words, the coating segments 36 may correspond to the semiconductor layer 14. In other embodiments, a coating layer is formed on the second sealing material 32B1 and the remaining second liner (which is on the top and sidewalls of the bit line structure BL), and the coating layer is patterned to form coating segments 36.

The patterning process includes forming a mask layer (not shown) on the coating layer, and then etching the portion of the coating layer not covered by the mask layer to form coating segments 36. For example, the mask layer may include photoresist, such as positive photoresist or negative photoresist. In some embodiments, the mask layer may include a hard mask.

Referring to FIG. 8, in some embodiments, the first sealing material 32T1, a portion of the second sealing material 32B1, a portion of the remaining second liner 32R, and a portion of the bit line structures BL that are in the region not covered by the coating segments 36 are removed. In some embodiments, after the first sealing material 32T1 is removed, the remaining first liner 31 is exposed. Then, a portion of the remaining first liner 31 is removed to form a patterned liner 31' according to the etch selectivity of the remaining first liner 31 and the remaining second liner 32R. For example, a portion of the remaining first liner 31 may be removed by a dry etching process.

Referring to FIG. 9, in some embodiments, a cover structure 38 is formed on the region not covered by the coating segments 36. The cover structure 38 includes nitride, for example. As shown in FIG. 9, in the region not covered by the coating segments 36, the cover structure 38 is disposed on the bit line structures BL and fills the space between the bit line structures BL. Moreover, an air gap AG3 is formed between the cover structure 38 and the patterned liner 31'.

Similarly, in the embodiments of the present disclosure, the space where the air gap AG3 exists may affect the capacitance of the bit line structure BL in the semiconductor structure 100. Since the air gap AG3 may contain air or close to vacuum (i.e., low pressure), the bit line capacitance of the semiconductor structure 100 may be effectively reduced, thereby improving the operating range of the semiconductor structure 100.

Based on the above description, through the method of forming the semiconductor structure according to the embodiments of the present disclosure, an air gap may be formed in the semiconductor structure, thereby reducing the bit line capacitance of the semiconductor structure and improving the operating range of the semiconductor structure.

The described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A method of forming a semiconductor structure, comprising:
- forming bit line structures on a substrate;
- forming a first liner on the bit line structures;
- forming a second liner on the first liner;
- removing a portion of the second liner to expose a portion of a top surface of the first liner;
- removing a portion of the first liner to form a space between each of the bit line structures and the second liner and form a remaining first liner; and
- forming a sealing material at an opening of the space to form an air gap between each bit line structure and the second liner, wherein the air gap comprises a first air gap and a second air gap above and below the remaining first liner respectively.

2. The method of forming the semiconductor structure as claimed in claim 1, wherein forming the sealing material at the opening of the space comprises:
- forming a first sealing material on each of the bit line structures; and
- forming a second sealing material between two adjacent bit line structures,
- wherein the first sealing material and the second sealing material are connected with a remaining second liner to form the first air gap and the second air gap.

3. The method of forming the semiconductor structure as claimed in claim 2, wherein materials of the first sealing material and the second sealing material are the same as the remaining second liner.

4. The method of forming the semiconductor structure as claimed in claim 2, further comprising:
- forming a coating layer on the first sealing material, the second sealing material, and the remaining second liner; and
- patterning the coating layer to form coating segments.

5. The method of forming the semiconductor structure as claimed in claim 4, further comprising:
- removing the first sealing material, a portion of the second sealing material, a portion of the remaining second liner, and a portion of the bit line structures that are in a region not covered by the coating segments; and
- forming a cover structure on the region not covered by the coating segments.

6. The method of forming the semiconductor structure as claimed in claim 5, wherein after removing the first sealing material, the remaining first liner is exposed, and the method of forming the semiconductor structure further comprises:
- removing a portion of the remaining first liner to form a patterned liner.

7. The method of forming the semiconductor structure as claimed in claim 6, wherein the cover structure is disposed on the bit line structures and fills a space between the bit line structures, and a third air gap is formed between the cover structure and the patterned liner.

8. The method of forming the semiconductor structure as claimed in claim 1, wherein a wet etching process is performed to remove a portion of the first liner.

9. The method of forming the semiconductor structure as claimed in claim 1, wherein removing the portion of the second liner to expose the portion of a top surface of the first liner comprises:

removing a portion of the second liner on topmost surfaces of the bit line structures.

10. The method of forming the semiconductor structure as claimed in claim 9, wherein removing the portion of the second liner to expose the portion of a top surface of the first liner further comprises:

removing another portion of the second liner between bottoms of two adjacent bit line structures.

11. The method of forming the semiconductor structure as claimed in claim 1, wherein etching rates of the first liner and the second liner are different.

12. A semiconductor structure, comprising:

a substrate;

bit line structures disposed on the substrate;

a liner structure disposed on the bit line structures, wherein in a cross-sectional view, the liner structure continuously covers tops and sidewalls of the bit line structures; and a first liner disposed between the bit line structures and the liner structure, wherein an air gap is formed between the first liner and the liner structure, and the air gap comprises a first air gap and a second air gap above and below the first liner respectively.

13. The semiconductor structure as claimed in claim 12, wherein the liner structure comprises a first sealing material disposed on each of the bit line structures and a second sealing material disposed between two adjacent bit line structures.

14. The semiconductor structure as claimed in claim 13, wherein materials of the first sealing material and the second sealing material comprises a material with a low dielectric constant.

* * * * *